(12) United States Patent
Lee

(10) Patent No.: US 7,358,563 B2
(45) Date of Patent: Apr. 15, 2008

(54) CMOS IMAGE SENSOR AND METHOD FOR FABRICATING THE SAME

(75) Inventor: Sang Gi Lee, Bucheon (KR)

(73) Assignee: Dongbu Electronics Co., Ltd, Seoul (KR)

( * ) Notice: Subject to any disclaimer, the term of this patent is extended or adjusted under 35 U.S.C. 154(b) by 133 days.

(21) Appl. No.: 11/320,467

(22) Filed: Dec. 29, 2005

(65) Prior Publication Data

US 2006/0145221 A1 Jul. 6, 2006

(30) Foreign Application Priority Data

Dec. 30, 2004 (KR) .................... 10-2004-0116427

(51) Int. Cl.
*H01L 29/76* (2006.01)
*H01L 29/94* (2006.01)
*H01L 31/00* (2006.01)

(52) U.S. Cl. .............. 257/327; 257/328; 257/492; 257/495; 438/268

(58) Field of Classification Search ............. 438/65, 438/66, 294, 440, 268; 257/294, 328, 432, 257/492, 327, 495
See application file for complete search history.

(56) References Cited

U.S. PATENT DOCUMENTS

| 7,078,260 | B2 * | 7/2006 | Jeon ............................ 438/65 |
| 2004/0092054 | A1 * | 5/2004 | Mouli et al. .................. 438/60 |
| 2004/0178465 | A1 * | 9/2004 | Merrill et al. .............. 257/440 |
| 2006/0138531 | A1 * | 6/2006 | Lee ............................ 257/327 |

* cited by examiner

*Primary Examiner*—Zandra V. Smith
*Assistant Examiner*—Telly D Green
(74) *Attorney, Agent, or Firm*—McKenna Long & Aldridge LLP

(57) ABSTRACT

A CMOS image sensor and a method for fabricating the same can ensure isolation characteristics using a shallow trench isolation (STI) process and a selective epitaxy method. The CMOS image sensor and method for fabricating the same can also reduce pixel size. The CMOS image sensor includes a semiconductor substrate, a first photodiode, a first epitaxial layer, a second epitaxial layer, a plurality of device isolation layers formed in isolation regions formed at the second epitaxial layer, a second photodiode formed between the device isolation layers, and a third epitaxial layer.

12 Claims, 5 Drawing Sheets

CMOS IMAGE SENSOR AND METHOD FOR FABRICATING THE SAME

This application claims the benefit of Korean Patent Application No. 10-2004-0116427, filed on Dec. 30, 2004, which is hereby incorporated by reference for all purposes as if fully set forth herein.

BACKGROUND OF THE INVENTION

1. Field of the Invention

The present invention relates to a CMOS image sensor and a method for fabricating the same. More particularly, the present invention relates to a vertical CMOS image sensor and a method for fabricating the same, which can reduce pixel size and can ensure isolation characteristics using a shallow trench isolation (STI) process and a selective epitaxy method.

2. Discussion of the Related Art

Generally, an image sensor is a semiconductor device that converts an optical image to an electric signal. In a CCD (charge coupled device) image sensor, a plurality of MOS (metal-oxide-metal) capacitors are arranged close to one another to transfer and store electric charge carriers. In a CMOS (complementary MOS) image sensor, a plurality of MOS transistors corresponding to the number of pixels are fabricated by CMOS technology using a control circuit and a signal processing circuit as peripheral circuits. A switching system of sequentially detecting outputs using the MOS transistors is adopted.

A CMOS image sensor and a method of fabricating the same according to the related art is described with reference to the attached drawings.

FIG. 1 is a cross-sectional view illustrating a CMOS image sensor fabricated by a method of fabricating a CMOS image sensor according to the related art.

A red photodiode 11 is formed on a semiconductor substrate 10 including a first epitaxial layer (not shown). A second epitaxial layer 12 is grown thereon, and a first photoresist pattern (not shown) which exposes a plug region is formed on the second epitaxial layer 12. Ions are injected into the second epitaxial layer 12 exposed by the first photoresist pattern to form a first plug 13 connected to the red photodiode 11 for extracting a signal therefrom. The first photoresist pattern is removed and a second photoresist pattern (not shown) is formed on the second epitaxial layer 12. Ions are injected into the second epitaxial layer 12 exposed by the second photoresist pattern to form a green photodiode 14 in the second epitaxial layer 12. The second photoresist pattern is then removed.

A third epitaxial layer 15 is grown on the second epitaxial layer 12 including the green photodiode 14. A shallow trench isolation (STI) region 16 is formed at an isolation region in the third epitaxial layer 15.

Thereafter, a well process is performed. A third photoresist pattern (not shown) is formed on the third epitaxial layer 15. Then, ions are injected into the third epitaxial layer 15 exposed by the third photoresist pattern to form a second plug 17 connected to the red photodiode 11 and the green photodiode 14.

The method of fabricating the CMOS image sensor according to the related art has the following problems.

Since a diffusion layer is used when the photodiode is formed, there is a limit in ensuring isolation characteristics between pixels and between a plug unrelated to the pixel and the photodiode.

Also, since the photodiode is formed below the STI region, it is difficult to ensure isolation characteristics between the photodiodes. Accordingly, there is a limit in reducing pixel size.

SUMMARY OF THE INVENTION

Accordingly, the present invention is directed to a CMOS image sensor and a method for fabricating the same that substantially obviates one or more problems due to limitations and disadvantages of the related art.

An advantage of the present invention is to provide a CMOS image sensor and a method for fabricating the same in which light-shielding layers are formed between micro lenses to improve reflection characteristics and to protect the micro lenses upon packaging Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, a CMOS image sensor includes a semiconductor substrate including a first epitaxial layer, a first photodiode formed on the semiconductor substrate including the first epitaxial layer, a second epitaxial layer formed on the semiconductor substrate including the first photodiode, a plurality of device isolation layers formed in isolation regions, wherein the isolation regions are formed at the second epitaxial layer, a second photodiode formed in the second epitaxial layer between the device isolation layers, and a third epitaxial layer formed on the second epitaxial layer including the second photodiode.

In another aspect of the present invention, the third epitaxial layer is selectively grown on the second epitaxial layer except the device isolation layers.

In another aspect of the present invention, the CMOS image sensor further includes a first plug formed on the semiconductor substrate for extracting a signal from the first photodiode, and a second plug formed on the semiconductor substrate for extracting a signal from the second photodiode.

In another aspect of the present invention, the first plug is formed from the semiconductor substrate at a side of the first photodiode to the second epitaxial layer and the second plug is formed in the third epitaxial layer.

In another aspect of the present invention, a method of fabricating a CMOS image sensor includes providing a semiconductor substrate including a first epitaxial layer, forming a first photodiode on the semiconductor substrate including the first epitaxial layer, forming a second epitaxial layer on the semiconductor substrate including the first photodiode, forming a first insulating layer on the second epitaxial layer, selectively etching the second epitaxial layer and the first insulating layer of an isolation region to form a plurality of trenches, forming a second insulating layer on the first insulating layer including the trenches to fill the first insulating layer in the trenches, planarizing the second insulating layer to form a plurality of device isolation layers, removing the first insulating layer; forming a second photodiode in the second epitaxial layer between the device isolation layers, and forming a third epitaxial layer on the second epitaxial layer including the second photodiode.

In another aspect of the present invention, the third epitaxial layer is selectively grown on the second epitaxial layer except the device isolation layers.

In another aspect of the present invention, the method further includes forming a first plug on the semiconductor substrate for extracting a signal from the first photodiode; and forming a second plug on the semiconductor substrate for extracting a signal from the second photodiode.

In another aspect of the present invention, the first plug is formed from the semiconductor substrate at a side of the first photodiode to the second epitaxial layer and the second plug is formed in the third epitaxial layer.

In another aspect of the present invention, the step of forming the first photodiode further includes injecting first type impurity ions into an entire surface of the semiconductor substrate including the first epitaxial layer, depositing a photoresist on the semiconductor substrate, patterning the photoresist to define an area of the first photodiode, injecting second type impurity ions into the area of the first photodiode to form the first photodiode, and removing the photoresist.

In another aspect of the present invention, the step of forming of the micro lenses includes forming light shielding layers on the second insulating layer, forming a micro lens material on the second insulating layer including the light shielding layers, etching the micro lens material to planarize the micro lens material, selectively etching the planarized micro lens material, and forming the micro lenses by performing a bake process.

In another aspect of the present invention, the step of forming the second photodiode further includes injecting first type impurity ions into the second epitaxial layer, depositing a photoresist on the second epitaxial layer, patterning the photoresist to define an area of the second photodiode, injecting second type impurity ions into the area of the second photodiode to form the second photodiode, and removing the photoresist.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principles of the invention. In the drawings.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or similar parts.

Figure 1:
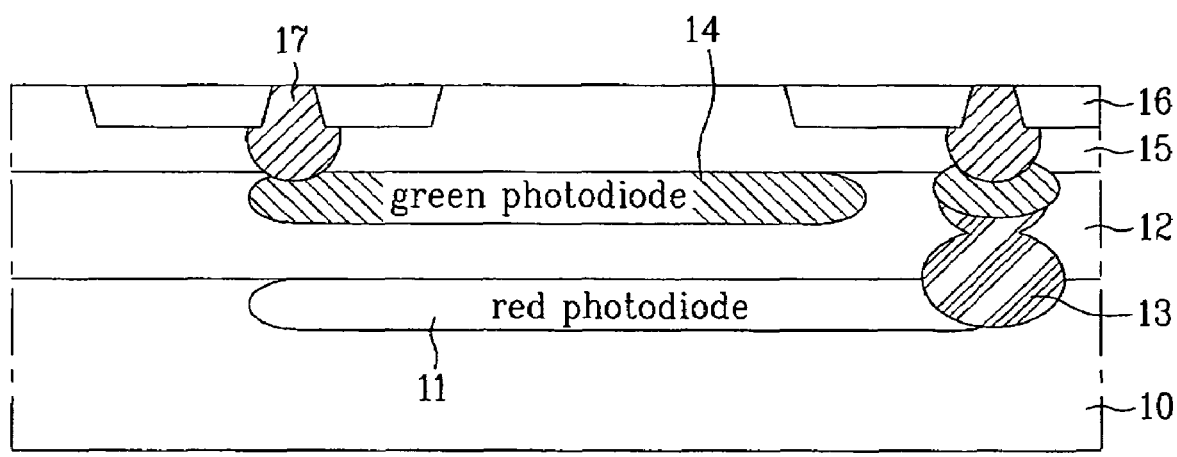
FIG. 1 is a cross-sectional view illustrating a CMOS image sensor according to the related art.
Figure 2A:
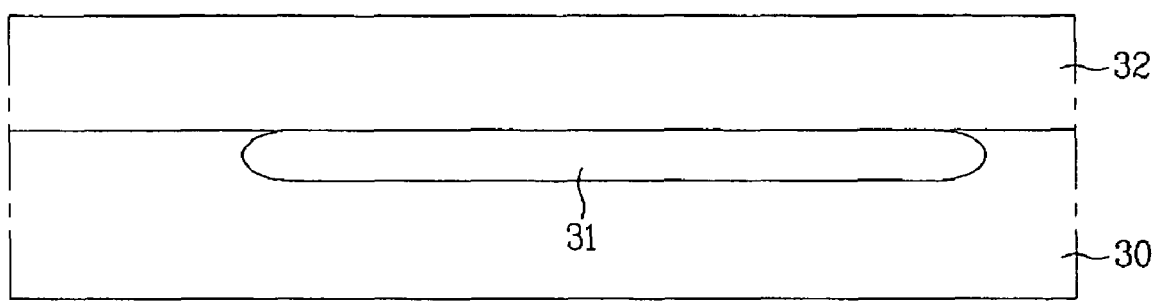
FIGS. 2A to 2H are cross-sectional views illustrating a method of fabricating a CMOS image sensor according to the present invention.

As illustrated in FIG. 2A, boron ions are injected into an entire surface of a semiconductor substrate 30 in which a first epitaxial layer (not shown) is grown. Then, a first photoresist (not shown) is coated on the semiconductor substrate 30 and partially etched to form a first photoresist pattern (not shown) which exposes a red photodiode region. Arsenic ions are injected into the first epitaxial layer to form a red photodiode 31 and then the first photoresist pattern is removed. Then, a second epitaxial layer 32 is grown on the semiconductor substrate 30 including the red photodiode 31 at a predetermined thickness.

Figure 2B:
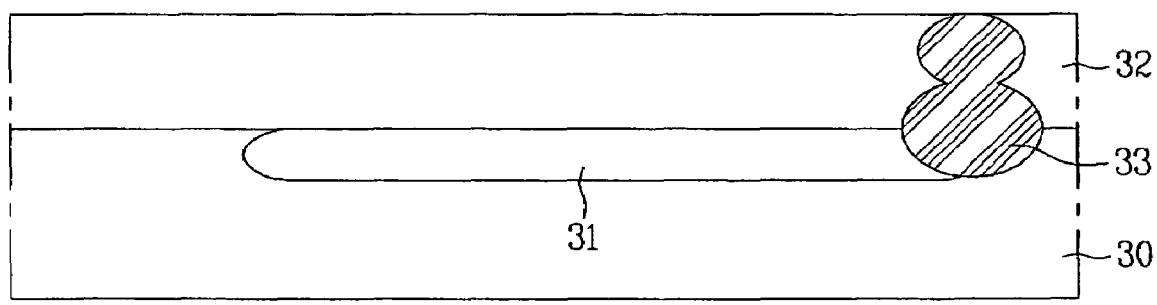

As illustrated in FIG. 2B, in order to form a first plug connected to the red photodiode 31 for extracting a signal therefrom, a second photoresist (not shown) is coated and partially etched to form a second photoresist pattern (not shown) which exposes a first plug region. Phosphorus ions are injected into the second epitaxial layer 32 using the second photoresist pattern as a mask to form a first plug 33. Then, the second photoresist pattern is removed.

Figure 2C:
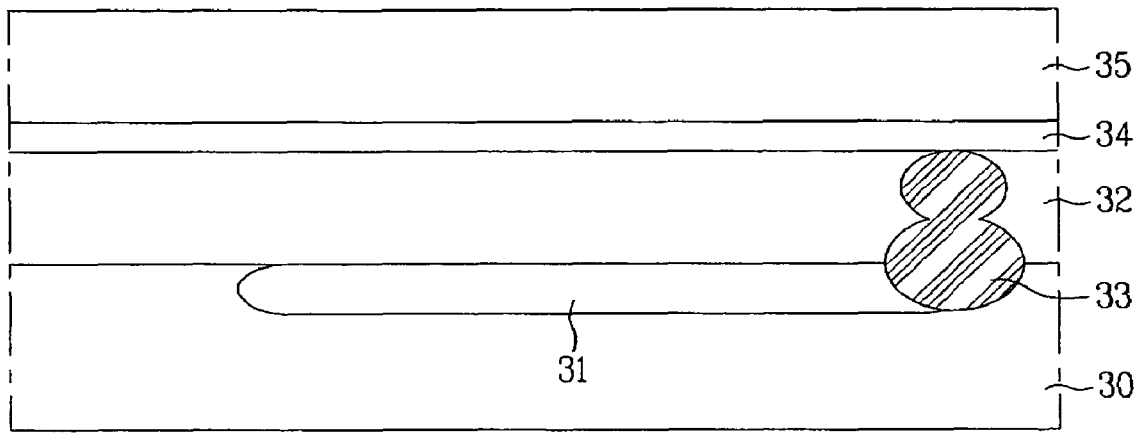

As illustrated in FIG. 2C, in order to apply a STI method to a pixel to ensure isolation characteristics, a pad oxide layer 34 is laminated on the second epitaxial layer 32 and a nitride layer 35 is formed on the pad oxide layer 34.

Figure 2D:
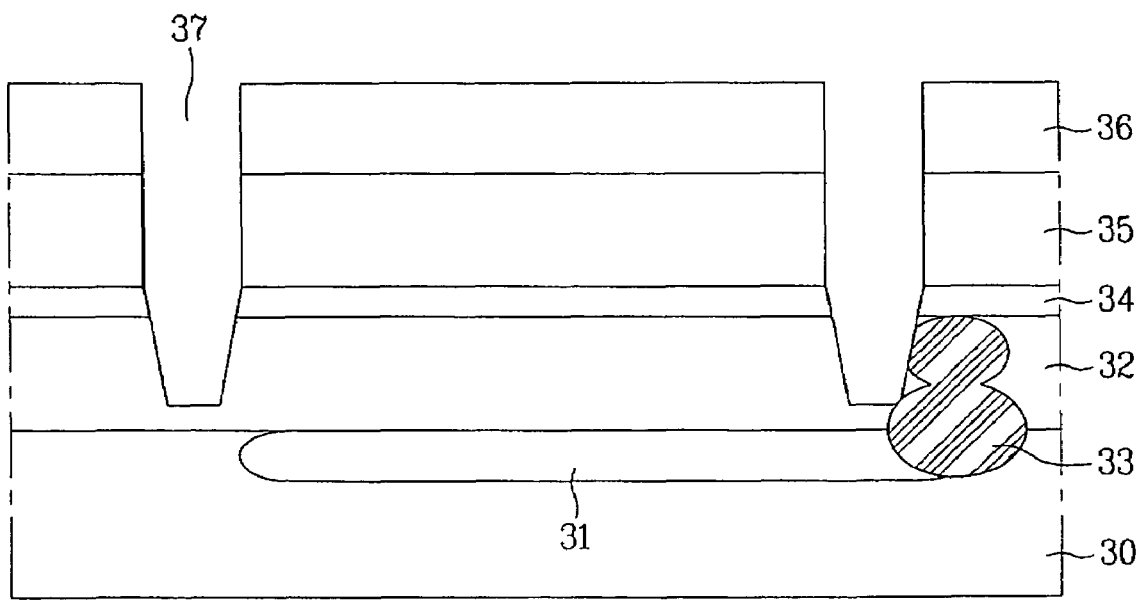

As illustrated in FIG. 2D, a third photoresist (not shown) is coated on the nitride layer 35 and partially etched to form a third photoresist pattern 36 which exposes an isolation region. A portion of the second epitaxial layer 32, the pad oxide layer 34, and the nitride layer 35 are selectively etched using the third photoresist pattern 36 as a mask to form trenches 37 in the isolation region.

Figure 2E:
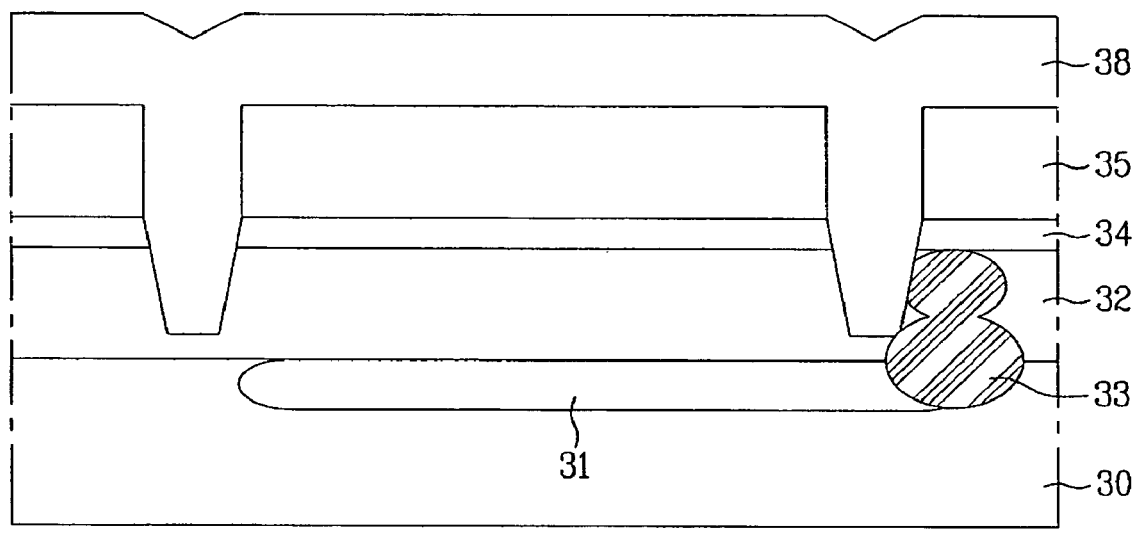

As illustrated in FIG. 2E, the third photoresist pattern 36 is removed and then an oxide layer 38 is laminated onto the structure. The oxide layer 38 fills in the trenches 37.

Figure 2F:
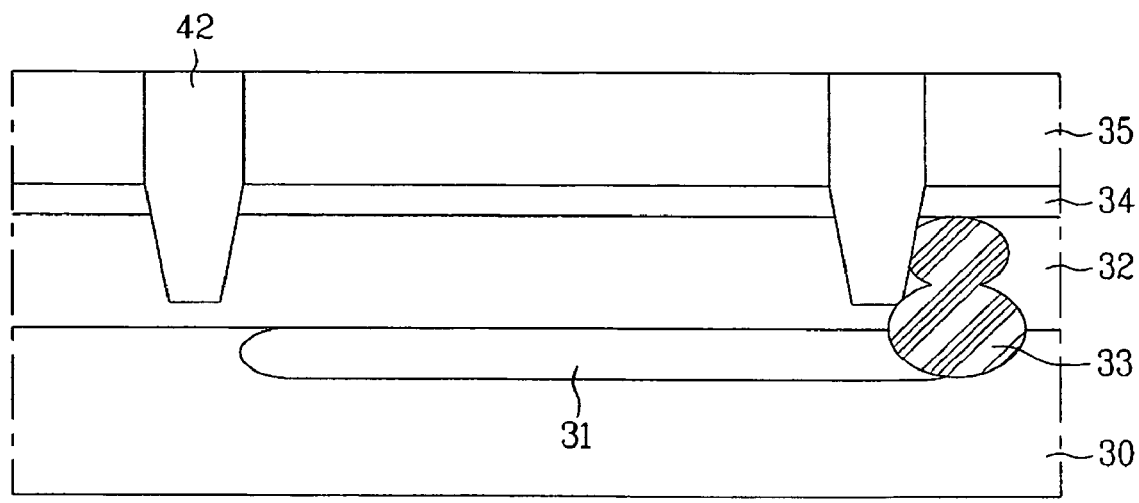

As illustrated in FIG. 2F, the oxide layer 38 is etched and planarized using a chemical mechanical polishing (CMP) method until the surface of the nitride layer 35 is exposed. Thus, device isolation layers 42 are formed.

Figure 2G:
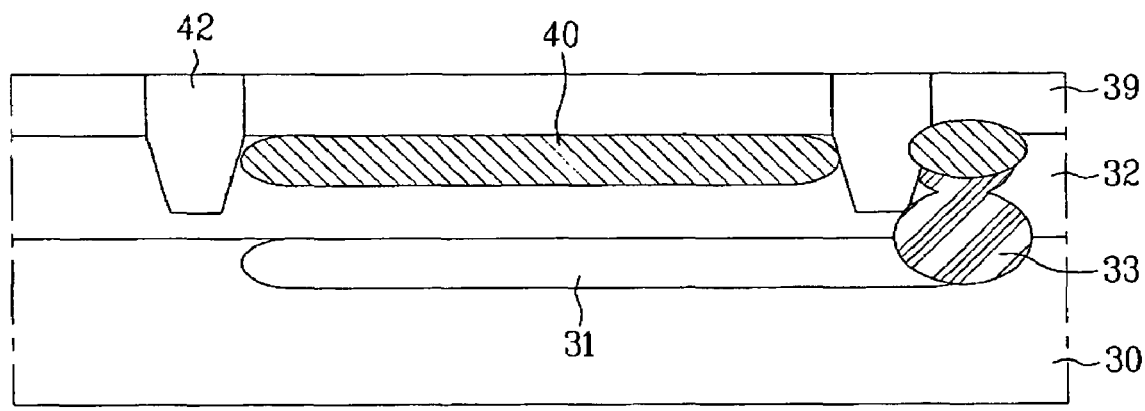

As illustrated in FIG. 2G, the nitride layer 35 and the pad oxide layer 34 are sequentially removed and then a green photodiode 40 is formed in the second epitaxial layer 32 between the device isolation layers 42. The green photodiode 40 may be formed using the same method for forming the red photodiode 31.

Then, a third epitaxial layer 39 is selectively formed on the second epitaxial layer 32. The third epitaxial layer 39 may be formed on the second epitaxial layer 32 except the device isolation layers 42.

Figure 2H:
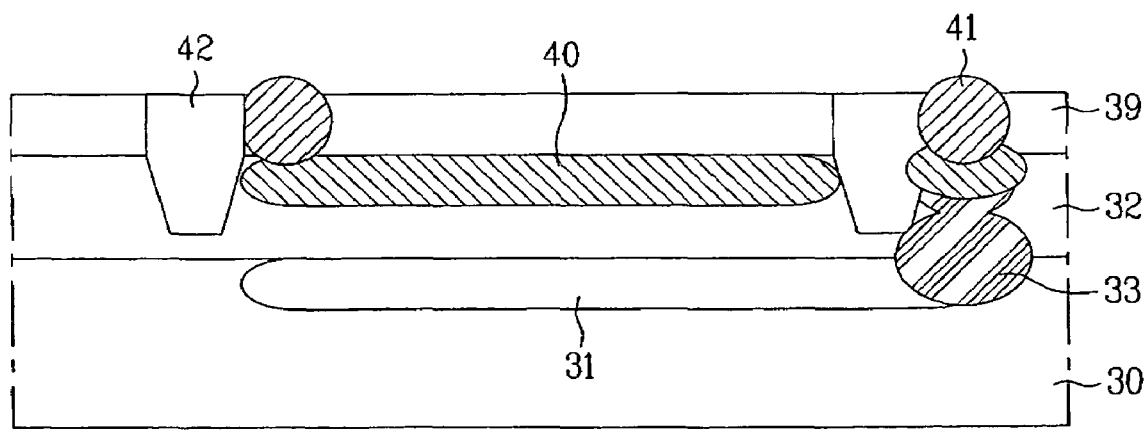

As illustrated in FIG. 2H, in order to form a second plug connected to the green photodiode 40 for extracting a signal therefrom, a fourth photoresist (not shown) is coated on the third epitaxial layer 39 and partially etched to form a fourth photoresist pattern (not shown) which exposes a second plug region. Arsenic ions are injected into the third epitaxial layer 39 to form a second plug 41.

When the pixel is formed using the aforementioned method, the size of the pixel can be reduced and a minimum line width of a vertical CMOS image sensor can be reduced to 0.13 μm.

According to the present invention, after an oxide layer is filled in an isolation region, a third epitaxial layer is selectively grown on the second epitaxial layer except in the isolation region. Thus, isolation characteristics between photodiodes can be improved. In addition, it is possible to reduce pixel size and therefore, improve integration and resolution.

What is claimed is:

1. A CMOS image sensor comprising:
a semiconductor substrate including a first epitaxial layer;
a first photodiode formed on the semiconductor substrate including the first epitaxial layer;

a second epitaxial layer formed on the semiconductor substrate including the first photodiode;

a plurality of device isolation layers formed in isolation regions, wherein the isolation regions are formed at the second epitaxial layer;

a second photodiode formed in the second epitaxial layer between the device isolation layers; and a third epitaxial layer formed on the second epitaxial layer including the second photodiode.

2. The CMOS image sensor according to claim 1, wherein the third epitaxial layer is selectively grown on the second epitaxial layer except the device isolation layers.

3. The CMOS image sensor according to claim 1, further comprising:

a first plug formed on the semiconductor substrate for extracting a signal from the first photodiode; and a second plug formed on the semiconductor substrate for extracting a signal from the second photodiode.

4. The CMOS image sensor according to claim 3, wherein the first plug is formed from the semiconductor substrate at a side of the first photodiode to the second epitaxial layer and the second plug is formed in the third epitaxial layer.

5. A method of fabricating a CMOS image sensor comprising:

providing a semiconductor substrate including a first epitaxial layer;

forming a first photodiode on the semiconductor substrate including the first epitaxial layer;

forming a second epitaxial layer on the semiconductor substrate including the first photodiode;

forming a first insulating layer on the second epitaxial layer;

selectively etching the second epitaxial layer and the first insulating layer of an isolation region to form a plurality of trenches;

forming a second insulating layer on the first insulating layer including the trenches to fill the first insulating layer in the trenches;

planarizing the second insulating layer to form a plurality of device isolation layers;

removing the first insulating layer;

forming a second photodiode in the second epitaxial layer between the device isolation layers; and forming a third epitaxial layer on the second epitaxial layer including the second photodiode.

6. The method according to claim 5, wherein the third epitaxial layer is selectively grown on the second epitaxial layer except the device isolation layers.

7. The method according to claim 5, further comprising:

forming a first plug on the semiconductor substrate for extracting a signal from the first photodiode; and forming a second plug on the semiconductor substrate for extracting a signal from the second photodiode.

8. The method according to claim 7, wherein the first plug is formed from the semiconductor substrate at a side of the first photodiode to the second epitaxial layer and the second plug is formed in the third epitaxial layer.

9. The method according to claim 5, wherein the step of forming the first photodiode further comprises:

injecting first type impurity ions into an entire surface of the semiconductor substrate including the first epitaxial layer;

depositing a photoresist on the semiconductor substrate;

patterning the photoresist to define an area of the first photodiode;

injecting second type impurity ions into the area of the first photodiode to form the first photodiode; and removing the photoresist.

10. The method according to claim 5, wherein the step of forming the second photodiode further comprises:

injecting first type impurity ions into the second epitaxial layer;

depositing a photoresist on the second epitaxial layer;

patterning the photoresist to define an area of the second photodiode;

injecting second type impurity ions into the area of the second photodiode to form the second photodiode; and removing the photoresist.

11. The method according to claim 5, further including forming micro lenses.

12. The method according to claim 11, wherein the step of forming the micro lenses further comprises:

forming light shielding layers on the second insulating layer;

forming a micro lens material on the second insulating layer including the light shielding layers;

etching the micro lens material to planarize the micro lens material;

selectively etching the planarized micro lens material; and forming the micro lenses by performing a bake process.

* * * * *